United States Patent
Walczyk et al.

(10) Patent No.: US 11,581,237 B2
(45) Date of Patent: Feb. 14, 2023

(54) COOLING APPARATUSES FOR MICROELECTRONIC ASSEMBLIES

(71) Applicant: Intel Corporation, Santa Clara, CA (US)

(72) Inventors: Joe F. Walczyk, Tigard, OR (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1094 days.

(21) Appl. No.: 16/012,126

(22) Filed: Jun. 19, 2018

(65) Prior Publication Data
US 2019/0385925 A1  Dec. 19, 2019

(51) Int. Cl.
| | |
|---|---|
| *H01L 23/367* | (2006.01) |
| *H01L 21/48* | (2006.01) |
| *H01L 23/46* | (2006.01) |
| *H01L 23/373* | (2006.01) |

(52) U.S. Cl.
CPC ...... *H01L 23/3675* (2013.01); *H01L 21/4882* (2013.01); *H01L 23/3677* (2013.01); *H01L 23/46* (2013.01); *H01L 23/3736* (2013.01)

(58) Field of Classification Search
CPC . H01L 23/3675; H01L 23/3677; H01L 23/46; H01L 23/3736
See application file for complete search history.

(56) References Cited

U.S. PATENT DOCUMENTS

| | | | | |
|---|---|---|---|---|
| 5,022,462 A | * | 6/1991 | Flint | H01L 23/467 |
| | | | | 165/185 |
| 5,168,348 A | * | 12/1992 | Chu | H01L 23/4338 |
| | | | | 257/713 |
| 5,396,403 A | | 3/1995 | Patel | |
| 6,269,864 B1 | | 8/2001 | Kabadi | |
| 6,639,799 B2 | | 10/2003 | Prasher et al. | |
| 6,886,627 B2 | | 5/2005 | Kozyra et al. | |
| 6,963,130 B1 | * | 11/2005 | Djekic | H01L 23/4093 |
| | | | | 257/713 |
| 7,473,995 B2 | | 1/2009 | Rumer et al. | |
| 7,578,337 B2 | * | 8/2009 | Spokoiny | F28F 3/12 |
| | | | | 165/80.4 |
| 2008/0093733 A1 | * | 4/2008 | Hsu | H01L 23/3128 |
| | | | | 257/722 |
| 2012/0063085 A1 | * | 3/2012 | Dede | F28F 3/048 |
| | | | | 165/165 |
| 2012/0097382 A1 | * | 4/2012 | Chen | H01L 23/473 |
| | | | | 165/185 |

(Continued)

*Primary Examiner* — Peniel M Gumedzoe
(74) *Attorney, Agent, or Firm* — Akona IP PC

(57) ABSTRACT

Microelectronic assemblies, and related devices and methods, are disclosed herein. For example, in some embodiments, a microelectronic assembly may include a package substrate having a surface; a die having a first surface and an opposing second surface, wherein the first surface of the die is coupled to the surface of the package substrate; and a cooling apparatus that may include a conductive base having a first surface and an opposing second surface, wherein the first surface of the conductive base is in thermal contact with the second surface of the die, and a plurality of conductive structures on the second surface of the conductive base, wherein an individual conductive structure of the plurality of conductive structures has a width between 10 microns and 100 microns.

13 Claims, 11 Drawing Sheets

(56) References Cited

U.S. PATENT DOCUMENTS

2013/0199595 A1* 8/2013 Martin .................. H01L 31/052
  136/246
2019/0348345 A1* 11/2019 Parida ..................... H01L 25/18

* cited by examiner

COOLING APPARATUSES FOR MICROELECTRONIC ASSEMBLIES

BACKGROUND

Electronic components, such as microprocessors and integrated circuits, generally produce heat. Excessive heat may degrade performance, reliability, life expectancy of an electronic component and may even cause component failure. Heat sinks, heat spreaders, heat pipes, and other similar thermal solutions are commonly used for dissipating heat and reducing the operational temperature of electronic components.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
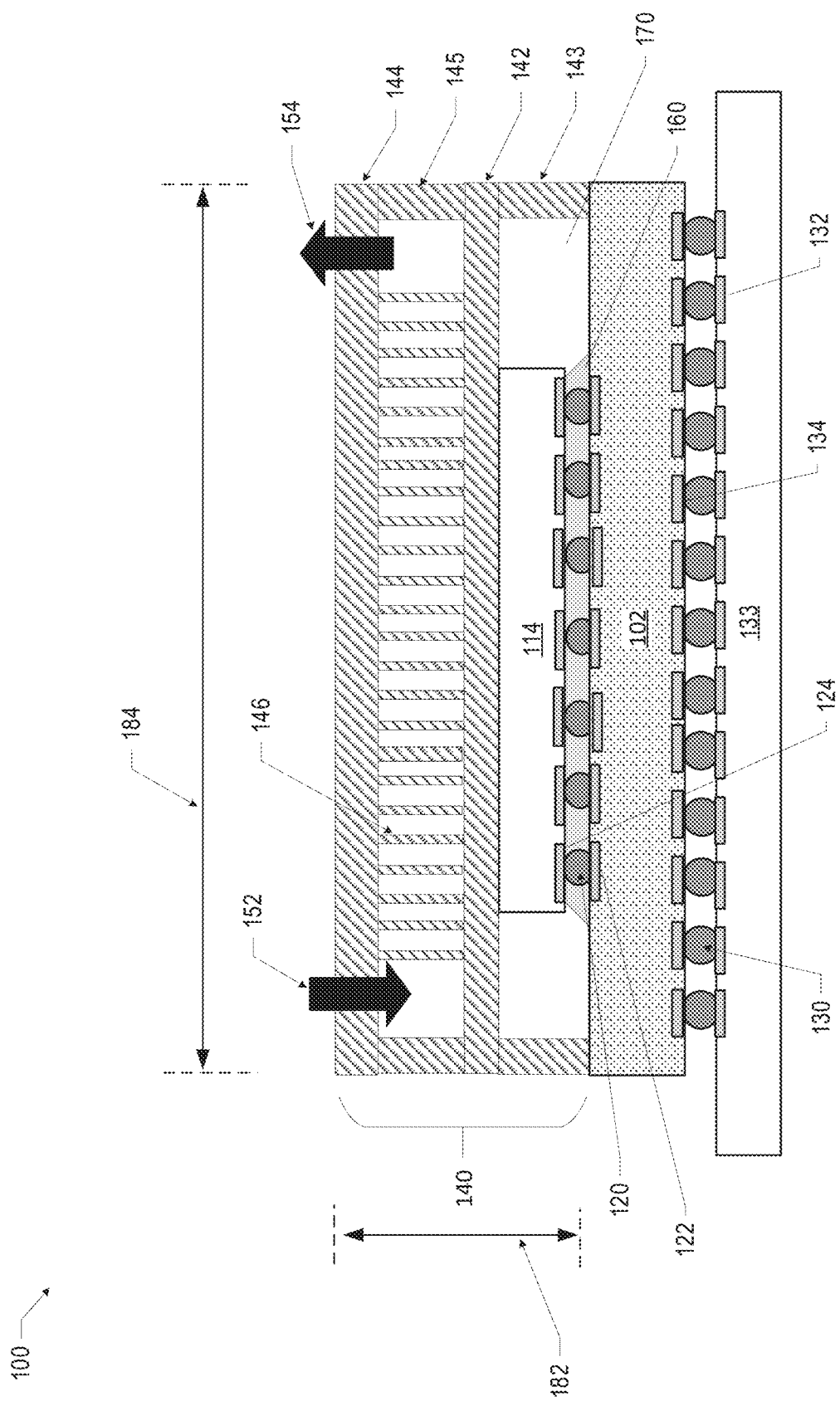
FIG. 1A is a side, cross-sectional view of an example microelectronic assembly having a cooling apparatus, in accordance with various embodiments.

Microelectronic assemblies that include cooling apparatuses, and related devices and methods, are disclosed herein. For example, in some embodiments, a microelectronic assembly may include a package substrate having a surface; a die having a first surface and an opposing second surface, wherein the first surface of the die is coupled to the surface of the package substrate; and a cooling apparatus that may include a conductive base having a first surface and an opposing second surface, wherein the first surface of the conductive base is in thermal contact with the second surface of the die, and a plurality of conductive structures on the second surface of the conductive base, wherein an individual conductive structure of the plurality of conductive structures has a width between 10 microns and 200 microns.

Some conventional integrated circuit (IC) devices may include a cooling apparatus, such as a heat spreader, a heat sink, or a cold plate, in order to transport heat generated by the electronic component during operation away from the electronic component. Typically, a cooling apparatus is in thermal contact with a back side of an electronic component on an IC package and transfers heat via thermal conduction. Some cooling apparatuses may include a base with fins projecting upwards from the base. As IC devices become smaller, the power density increases. A smaller and more efficient IC device cooling apparatus may be desirable. The microelectronic assemblies disclosed herein may be particularly advantageous for small and low-profile applications in computers, tablets, industrial robots, and consumer electronics (e.g., wearable devices).

Conventional cooling apparatus may be carved from a single block of material by traditional machining or using a skiving process. Some embodiments disclosed herein may utilize one or more processes that form a cooling apparatus with lithographic processes. The use of lithographic processes allows for a cooling apparatus having a conductive base and a plurality of conductive structures on or extending upwardly from the base to be formed with smaller dimensions and in any desired shape. A lithographically defined conductive structure may be customized for a desired purpose. For example, whereas a fin structure defined using traditional milling or skiving may be limited to a rectangular sheet of material that extends in lateral direction along the base, some embodiments disclosed herein may include non-linear conductive structures, such as wavy fins, tapered fins, circular pillars, non-circular pillars, or spirals, and may include asymmetrical conductive structures, such as fins having different widths and/or lengths. Further, conventional IC device cooling apparatuses may be manufactured separately and mounted to a surface of a package substrate. The use of lithographic processes allows for a cooling apparatus to be formed and integrated during the package substrate manufacturing process.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features. As used herein, a dimension in the x-direction is a length, a dimension in the y-direction is a width, and a dimension in the z-direction is a thickness or a height.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 3" may be used to refer to the collection of drawings of FIGS. 3A-3F, the phrase "FIG. 5" may be used to refer to the collection of drawings of FIGS. 5A-5E, etc. Although certain elements may be referred to in the singular herein, such elements may include multiple sub-elements. For example, "an insulating material" may include one or more insulating materials, and a "conductive layer" may include one or more conductive layers.

FIG. 1A is a side, cross-sectional view of a microelectronic assembly 100, in accordance with various embodiments. The microelectronic assembly 100 may include a die 114 coupled to a package substrate 102, and a cooling apparatus 140 in thermal contact with the die 114 and coupled to the package substrate 102. In particular, the package substrate 102 may include first conductive contacts 134 on a first surface and second conductive contacts 122 on an opposing second surface, the die 114 may include conductive contacts 124 on a first surface and an opposing second surface, and the conductive contacts 124 on the first surface of the die may be coupled to the second conductive contacts 122 on the second surface of the package substrate via first level interconnects 120. In some embodiments, an underfill material 160, such as a mold compound or an epoxy, may be disposed around the first level interconnects 120. In some embodiments, no underfill material may be disposed around the first level interconnects.

The cooling apparatus 140 may include a conductive base 142, a conductive lid 144, and a plurality of conductive structures 146 (e.g., as shown, vertical fins) extending between the conductive base 142 and the conductive lid 144. The conductive base 142 and the conductive lid 144 may form a cavity surrounding the plurality of conductive structures 146. The conductive base 142 may be coupled to, and in thermal contact with, the second surface of the die to dissipate heat from the die 114. In some embodiments, the conductive base 142 may include legs 143 for attaching the cooling apparatus 140 to the second surface of the package substrate. In some embodiments, the area 170 surrounding the die 114 (e.g., the area between the first surface of the conductive base and the second surface of the package substrate) may be filled with an epoxy or adhesive material. In some embodiments, the area 170 surrounding the die 114 may be filled with air. In some embodiments, a thermal interface material (TIM) may be between the second surface of the die 114 and the conductive base 142. The conductive lid 144 may include two or more orifices or openings (not shown) for a fluid inlet 152 and a fluid outlet 154. The conductive lid 144 may include legs 145 for coupling the conductive lid 144 to the conductive base 142 and may provide mechanical stability to the cooling apparatus 140. In some embodiments, the conductive lid 144 may be omitted.

During operation of the cooling apparatus 140, a fluid may enter the cavity formed by the conductive base 142 and the conductive lid 144 via the fluid inlet 152, may flow through the plurality of conductive structures 146, and may exit via the fluid outlet 154. The fluid may be circulated through the system using a pump or a fan, which may be a separate piece of equipment or may be part of a cooling device. The cooling apparatus may further include pipes or connections to a heat exchanger, a chiller, or other device for cooling the fluid (not shown) before returning the fluid to the fluid inlet. The fluid may be any suitable liquid or gas, such as a coolant, for example, water, fluorochemical liquids, silicone oil, ethylene glycol water, poly-alpha-olefin, or silicate ester, or helium, argon, or nitrogen, that may be circulated, usually by a pump or a fan (not shown), to dissipate heat more efficiently from the second surface of the die 114. The fluid may also include additives to prevent corrosion of the different components or to allow operation at higher/lower temperatures (e.g. additives to water to decrease its freezing point or increase its boiling point). The coolant used may depend on the coolant's properties, including viscosity and heat capacity, circulation flow rate, and the temperature rise during device operation.

The cooling apparatus 140 may have any suitable dimensions and any suitable shape. For example, in some embodiments, the cooling apparatus 140 may have an x-y dimension between 4 square millimeters ($mm^2$) and 400 $mm^2$, such that the x-dimension (not shown) may be between 4 mm and 400 mm, and the y-dimension 184 may be between 4 mm and 400 mm. In some embodiments, the cooling apparatus 140 may be square, such that an x-dimension equal to a y-dimension. In some embodiments, the cooling apparatus 140 may be rectangular, such that an x-dimension is different from a y-dimension. In some embodiments, the x-y dimensions of the cooling apparatus 140 may be circular, triangular, hexagonal, or any other suitable shape. In some embodiments, the cooling apparatus may have an overall height 182 (z-dimension, measured from the top surface of the package substrate 102 to the top surface of the conductive lid 144) between 0.5 mm and 2 mm.

The cooling apparatus may be made from any suitable conductive material, such as a metal. In some embodiments, the cooling apparatus 140 may include copper, silver, nickel, gold, aluminum, or other metals or alloys, for example. In some embodiments, the conductive base 142, the conductive structures 146, and the conductive lid 144 may be formed of the same material. In some embodiments, the conductive base 142, the conductive structures 146, and the conductive lid 144 may be formed of different materials.

Figure 1B:
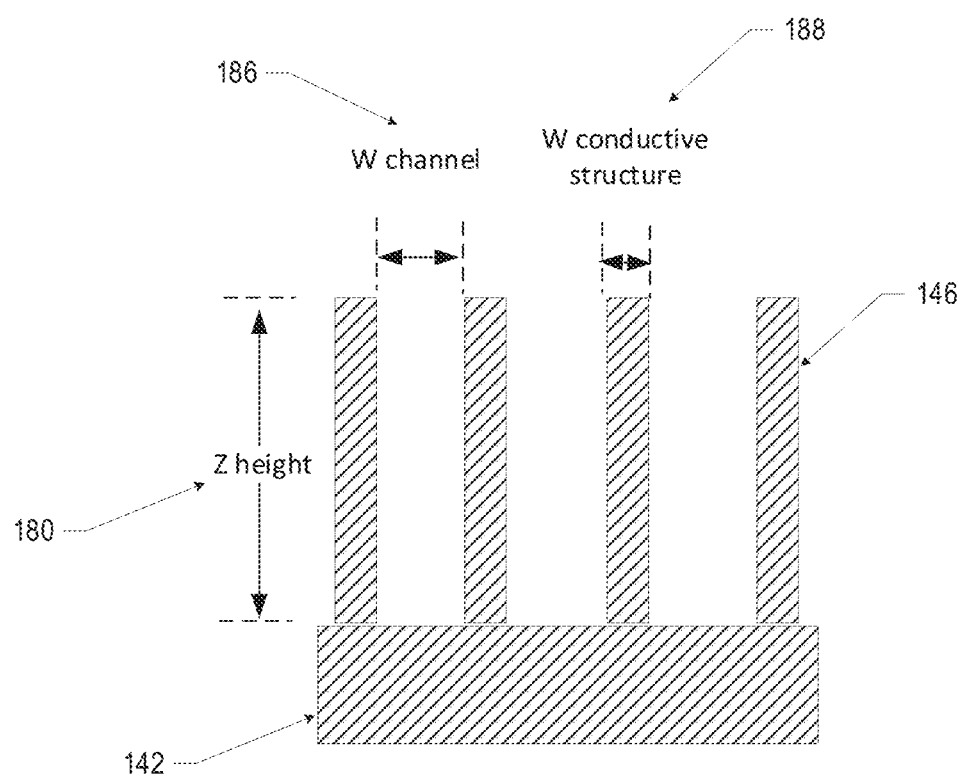
FIG. 1B is a magnified portion of FIG. 1A, in accordance with various embodiments.

As shown in FIG. 1B, in some embodiments, the conductive structures 146 may have a height 180 (e.g., z-height, measured from the top surface of the conductive base 142 to the bottom surface of the conductive lid 144) between 1 mm and 2 mm. In some embodiments, a width 188 of an individual conductive structure 146 may be between 10 microns and 100 microns. In some embodiments, an individual conductive structure may include a pillar such that a width of the pillar is equivalent to a diameter of the pillar. In some embodiments, a width of an individual channel 186 (e.g., a space between a conductive structure and an adjacent conductive structure) may be between 10 microns and 200 microns. In some embodiments, a conductive structure 146 may have an aspect ratio (height:width) between 10:1 and 20:1 (e.g., between 12:1 and 16:1, or between 15:1 and 18:1). In some embodiments, a conductive structure 146 may have a height 180 of 1,000 microns (1 mm) and a width 188 of 100 microns (e.g., aspect ratio of 10:1). In some embodiments, a conductive structure 146 may have a height 180 of 2,000 microns (2 mm) and a width 188 of 100 microns (e.g., aspect ratio of 20:1).

Although FIG. 1A illustrates a specific number and arrangement of conductive structures in the cooling apparatus 140, these are simply illustrative. The conductive structures may have any suitable number, shape, and arrangement, as described in detail below with reference to FIG. 2, to form channels for fluid flow. The conductive structures 146 may have any suitable shape. For example, in some embodiments, the conductive structures may include conductive vertical fins or walls. In some embodiments, the conductive structures 146 may include pillars or posts having any cross-sectional shape, including round, oblong, square, triangular, diamond, teardrop, and hexagonal, among others. The conductive structures 146 may have any suitable arrangement, including a symmetrical array (e.g., linear rows and columns), or an asymmetrical array (e.g., offset rows and columns, or areas having higher densities of conductive structures). The conductive structures disclosed herein (e.g., conductive fins and/or conductive pillars) may be formed of any appropriate conductive material, such as copper, silver, nickel, gold, aluminum, or other metals or alloys, for example.

The package substrate 102 may include an insulating material and one or more conductive pathways through the insulating material, in accordance with various embodiments. In some embodiments, the insulating material may be provided by a single material, while in other embodiments, the insulating material may include different layers formed of different materials. For example, a "base" layer of insulating material may be provided by a glass fiber reinforced core, a rigid carrier, or a peelable core panel, for example, while additional layers of insulating material may be provided by an epoxy-based laminate. In some embodiments, the package substrate 102 may be an organic substrate. The conductive pathways (not shown) in the package substrate 102 may couple any of the die 114 to the circuit board 133 (e.g., via the first level interconnects 120 and the second-level interconnects 130).

The microelectronic assembly of FIG. 1A may also include a circuit board 133 having conductive contacts 132 on a surface. The first conductive contacts 134 on the first surface of the package substrate 102 may be coupled to the conductive contacts 132 on the circuit board 133 by second-level interconnects 130. The second-level interconnects 130 illustrated in FIG. 1A are solder balls (e.g., for a ball grid array arrangement), but any suitable second-level interconnects 130 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second-level interconnects 130 may not couple the package substrate 102 to a circuit board 133, but may instead couple the package substrate 102 to another IC package, an interposer, or any other suitable component.

A number of elements in FIG. 1A are illustrated as being included in the microelectronic assembly 100, but a number of these elements may not be present in microelectronic assembly 100. For example, in various embodiments, the second-level interconnects 130, and/or the circuit board 133 may not be included. Further, FIG. 1A illustrates a number of elements that are omitted from subsequent drawings for ease of illustration, but may be included in any of the microelectronic assemblies 100 disclosed herein. Examples of such elements include the second-level interconnects 130, and/or the circuit board 133. Many of the elements of the microelectronic assemblies 100 of FIG. 1A are included in other ones of the accompanying figures; the discussion of these elements is not repeated when discussing these figures, and any of these elements may take any of the forms disclosed herein. A number of elements are not illustrated in FIG. 1A, but may be present in microelectronic subassemblies 100, for example, additional active components, such as dies, or additional passive components, such as surface-mount resistors, capacitors, and/or inductors, may be disposed on the top surface or the bottom surface of the package substrate 102, and may be thermally connected to the cooling apparatus 140.

The elements of the microelectronic assembly 100 may have any suitable dimensions. For example, in some embodiments, a thickness of the package substrate 102 may be between 0.25 mm and 3 mm (e.g., between 0.25 millimeters and 2 millimeters, between 0.4 millimeters and 0.6 millimeters, or approximately 0.5 millimeters). In some embodiments, the package substrate may have an x-y dimension of between 4 $mm^2$ and 400 $mm^2$.

Although FIG. 1A depicts a single, surface mounted die 114, the microelectronic assemblies 100 disclosed herein may have any suitable number of dies 114, for example, additional surface mounted dies in thermal contact with the cooling apparatus 140. More generally, the microelectronic assemblies 100 disclosed herein may have any suitable arrangement of the dies 114, and any number of the dies 114. The die 114 may include any suitable circuitry. For example, in some embodiments, the die 114 may be an active or passive die, and the die 114 may include input/output circuitry, a processor, high bandwidth memory, or enhanced dynamic random access memory (EDRAM).

Figure 2A:
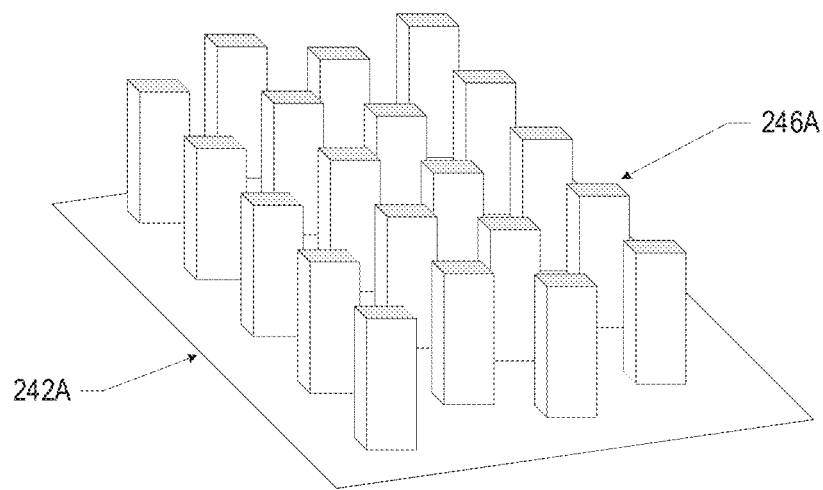
FIGS. 2A-2C are perspective views of example cooling apparatuses without a lid, in accordance with various embodiments.
Figure 2B:
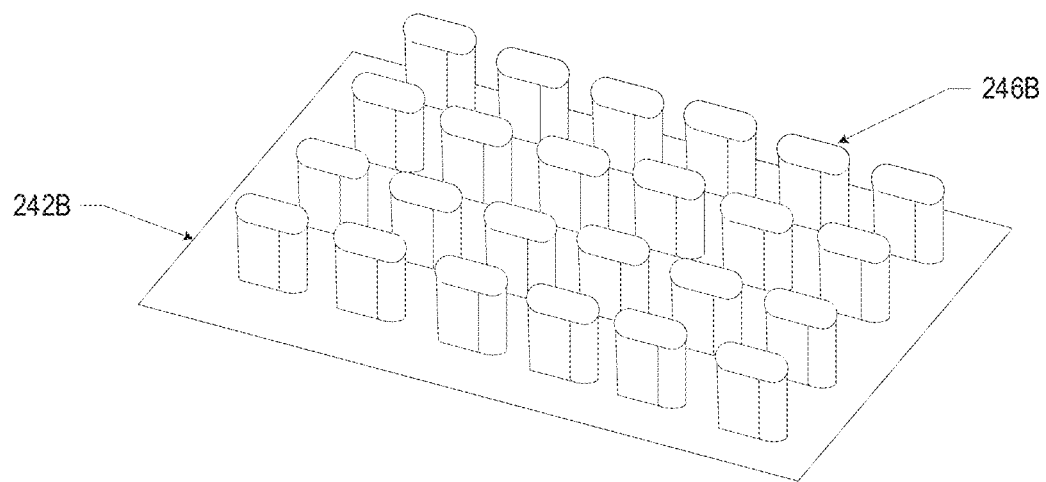
Figure 2C:
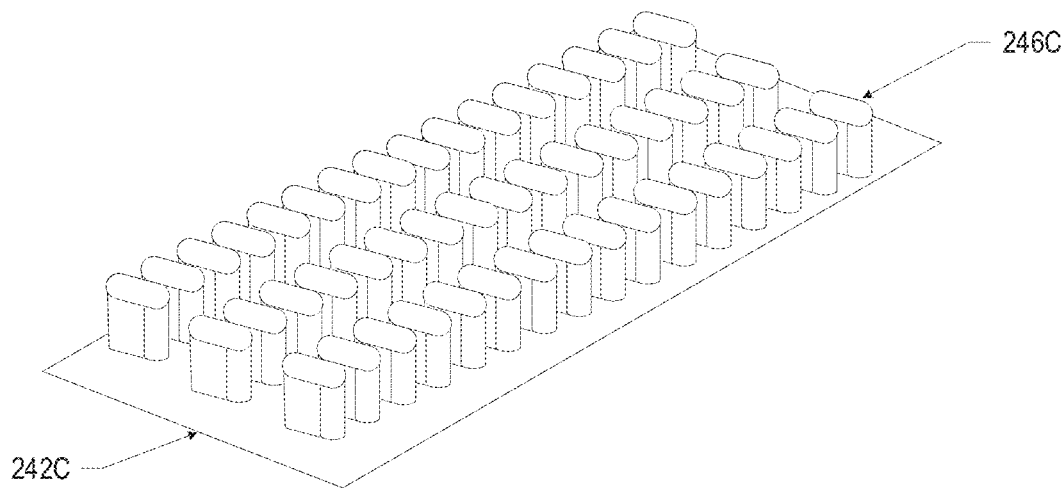

FIGS. 2A-2C are perspective views of example cooling apparatuses without a conductive lid, in accordance with various embodiments. As shown in FIG. 2, a plurality of conductive structures 246 on, or extending upwardly from, a conductive base 242 may have any suitable size, shape, and arrangement, as described above with reference to FIG. 1, including pillars. As shown in FIG. 2A, the plurality of conductive structures 246A may include vertical pillars having a square cross-section and arranged in an offset pattern. In another example, as shown in FIG. 2B, the plurality of conductive structures 246B may include vertical pillars having an oblong cross-section and arranged in a symmetrical array. In another example, as shown in FIG. 2C, the conductive structures 246C may include vertical pillars having an oblong cross-section and arranged closely together in rows to form a vertical fin or wall-like structure.

Figure 3C:
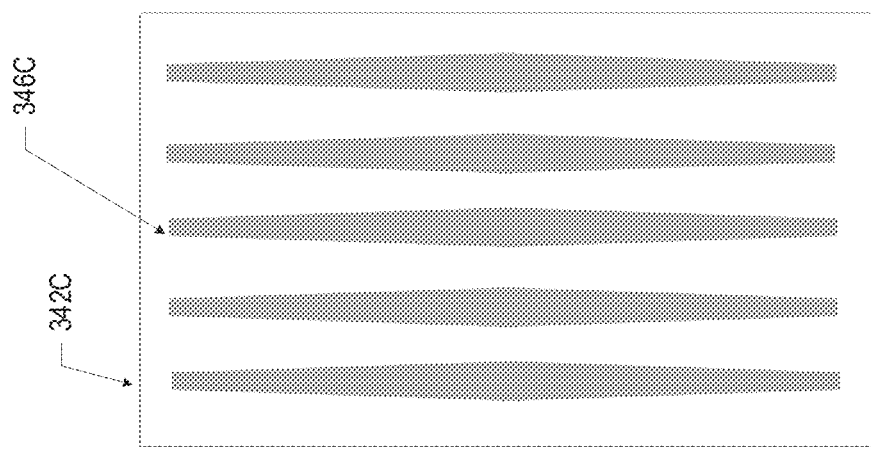
FIGS. 3A-3F are top views of example cooling apparatuses without a lid, in accordance with various embodiments.
Figure 3B:
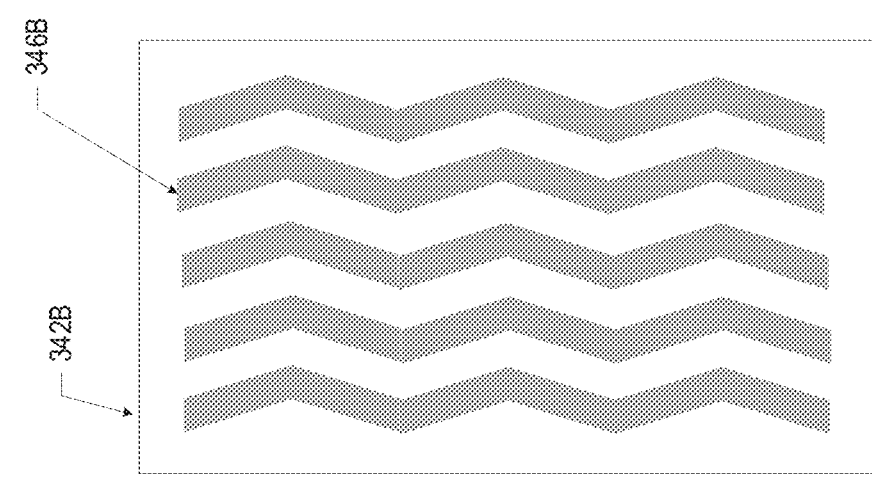
Figure 3A:
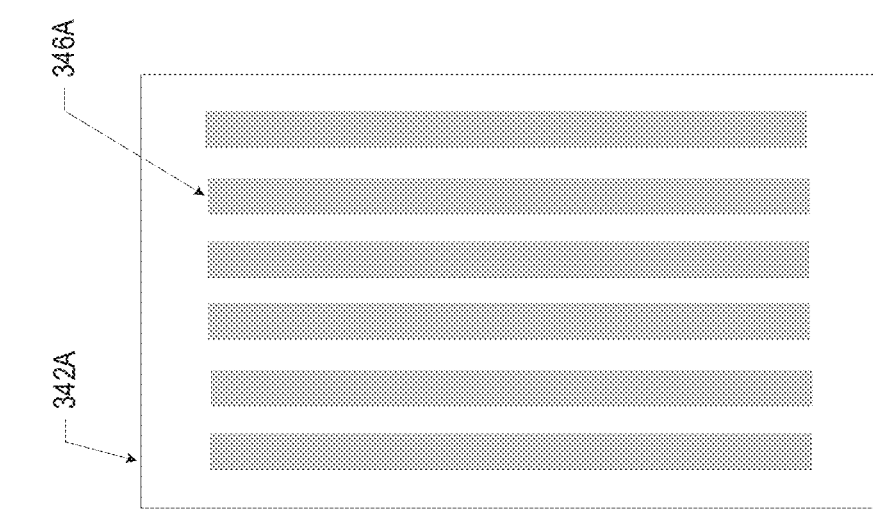
Figure 3F:
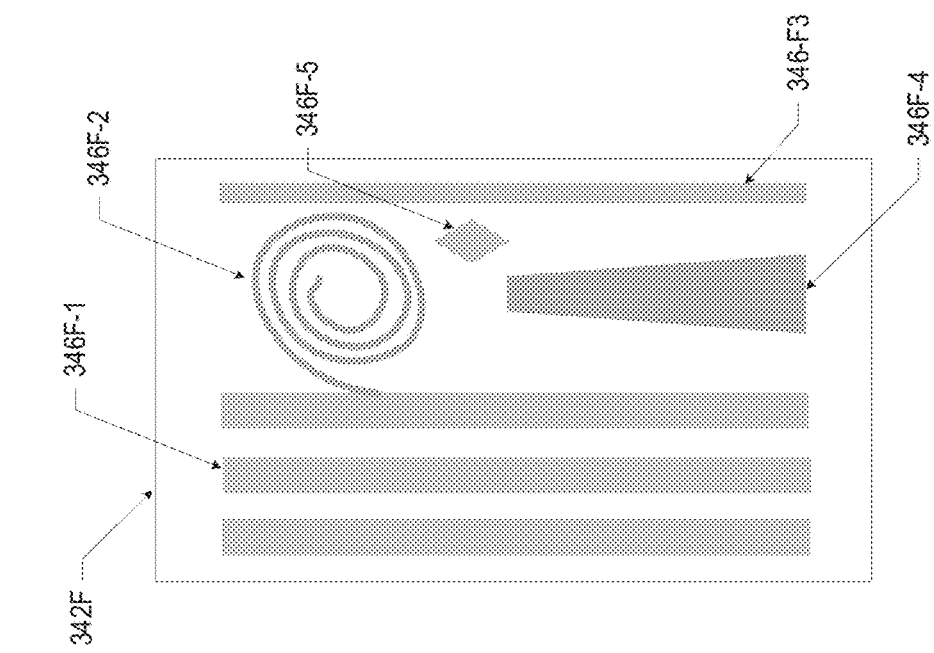
Figure 3E:
Figure 3D:
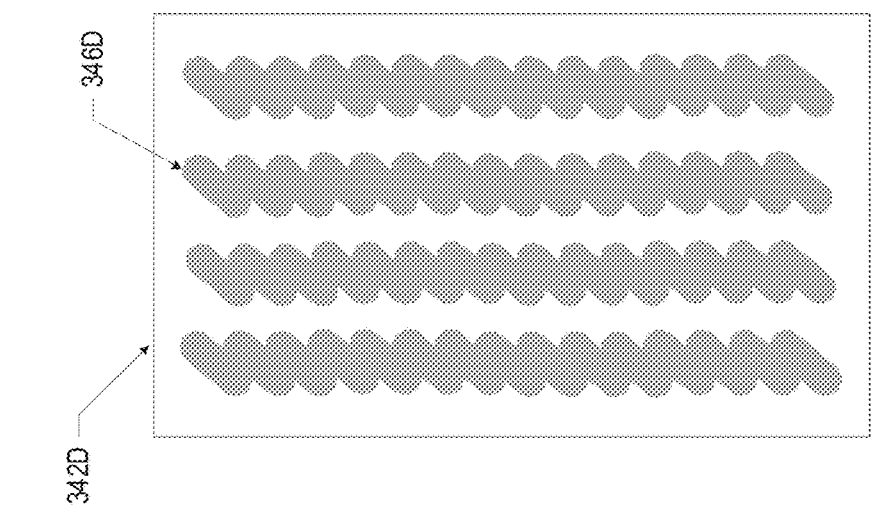

FIGS. 3A-3F are top views of example cooling apparatuses without a conductive lid, in accordance with various embodiments. As shown in FIG. 3, a plurality of conductive structures 346 on, or extending upwardly from, a conductive base 342 may have any suitable size, shape, and arrangement, as described above with reference to FIG. 1, including vertical fins. As shown in FIG. 3A, the plurality of conductive structures 346A may include vertical fins having planar or linear surfaces arranged in symmetrical columns. In another example, as shown in FIG. 3B, the plurality of conductive structures 346B may include wavy or zigzag fins arranged in symmetrical columns. In another example, as shown in FIG. 3C, the plurality of conductive structures 346C may include vertical fins having non-symmetrical shapes, such as tapered ends, or a bowtie shape (not shown) (e.g., wider at the ends and narrower in the middle). In another example, as shown in FIG. 3D, the plurality of conductive structures 346D may include vertical fins having a non-linear surface (e.g., a scalloped or bumpy surface). As shown in FIG. 3E, the plurality of conductive structures 346E may have different sizes and shapes. For example, a thickness of a vertical fin 346E-1 may be greater than a thickness of a vertical fin 346E-2, and a length of the vertical fin 346E-1 may be greater than a length of the vertical fin 346E-2. Further, as shown in FIG. 3E, a fin 346E-3 may have different thickness along its length. FIG. 3F shows that the conductive structures 346F may vary in size, shape, and arrangement on a conductive base 342F depending on a desired fluid flow pattern. For example, as shown in FIG. 3F, the conductive structures 346F may include fins having different thicknesses 346F-1, 346F-3, a vertical fin having a trapezoidal shape 346F-4, a pillar 346F-5 having a diamond cross-section, and a spiral shaped structure 346F-2.

Any suitable techniques may be used to manufacture the microelectronic assemblies disclosed herein. For example, FIGS. 4A-4F are side, cross-sectional views of various stages in an example process for manufacturing the microelectronic assembly 100 of FIG. 1A, in accordance with various embodiments. Although the operations discussed below with FIGS. 4A-4F (and others of the accompanying drawings representing manufacturing processes) are illustrated in a particular order, these operations may be performed in any suitable order. Additionally, although particular assemblies are illustrated in FIGS. 4A-4F (and others of the accompanying drawings representing manufacturing processes), the operations discussed below with reference to FIGS. 4A-4F may be used to form any suitable assemblies.

Figure 4A:
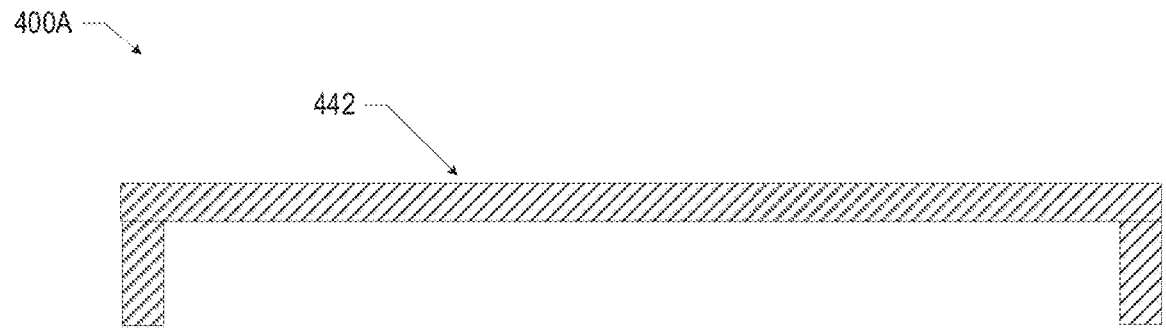
FIGS. 4A-4F are side, cross-sectional views of various stages in an example process for manufacturing the microelectronic assembly of FIG. 1, in accordance with various embodiments.

FIG. 4A illustrates an assembly 400A including a conductive base 442. In some embodiments, the conductive base 442 may be a pre-fabricated stamped base. In some embodiments, the conductive base 442 may be a copper sheet. In some embodiments, the conductive base 442 may include legs for attaching to a package substrate. In some embodiments, the conductive base may not include legs, and the "legs" may be formed conductive structures as describe below with reference to FIGS. 4B-4D. The conductive base 442 may be formed from any suitable conductive metal, for example, copper.

Figure 4B:
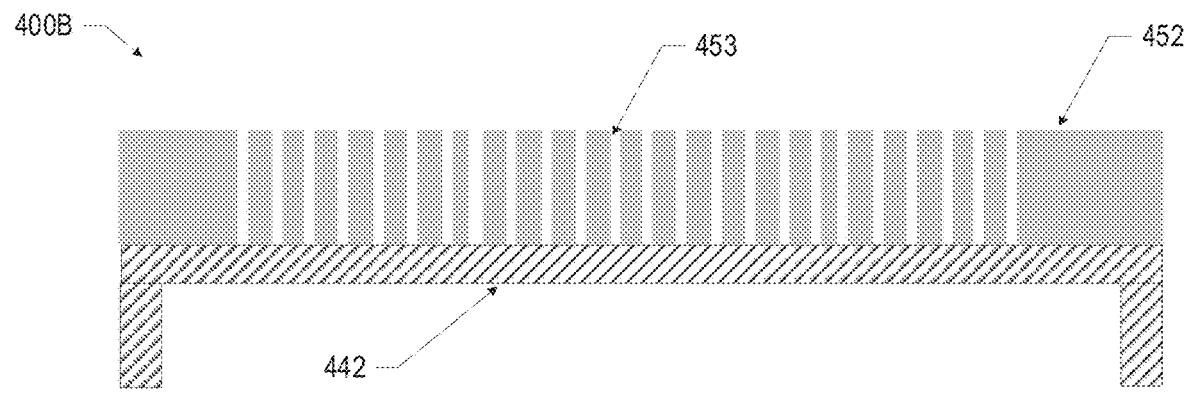

FIG. 4B illustrates an assembly 400B subsequent to depositing a photoresist material 452 over a top surface of the conductive base 442 and patterning the photoresist material to provide openings 453 for the formation of conductive structures. The photoresist material 452 may be patterned using any suitable technique, including a lithographic process (e.g., exposing the photoresist material to a radiation source through a mask and developing with a developer). The openings 453 may have any suitable size and shape for forming a conductive structure having desired characteristics. For example, opening 453 may be shaped to form any of the conductive structure described above with reference to FIG. 2. In some embodiments, a seed layer (not shown) may be formed over the top surface of the conductive base 442 prior to depositing the photoresist material. The seed layer may be any suitable conductive material, including copper. In some embodiments, the seed layer may be omitted.

Figure 4C:
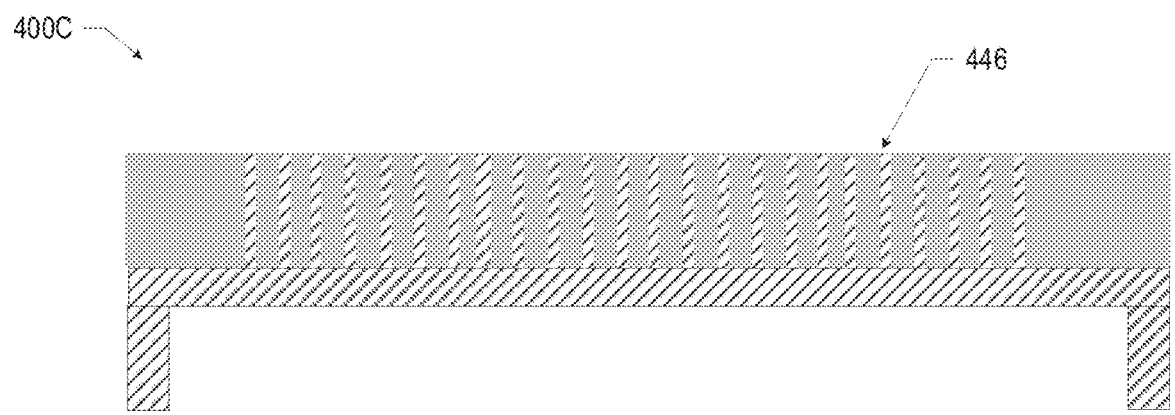

FIG. 4C illustrates an assembly 400C subsequent to depositing a conductive material in the openings 453 of assembly 400B to form conductive structures 446. The conductive material may be deposited using any suitable technique, including, for example, electroplating, sputtering, or electroless plating.

Figure 4D:
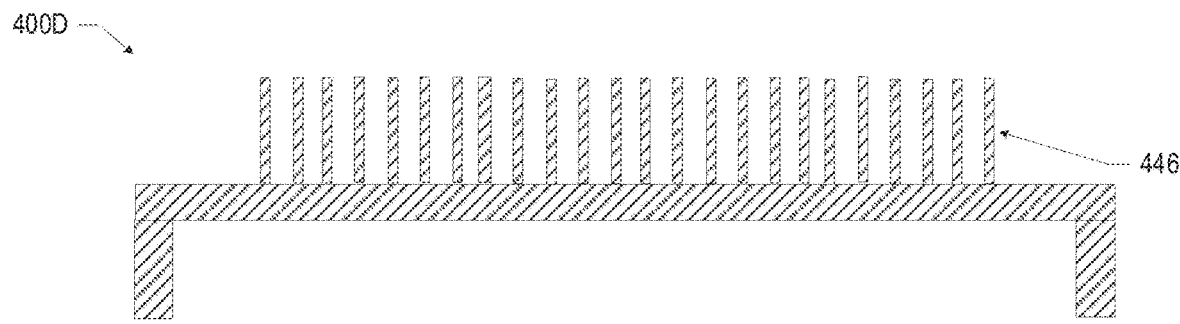

FIG. 4D illustrates an assembly 400D subsequent to stripping the photoresist material 452 to expose the conductive structures 446. In some embodiments, the conductive structures may be planarized using any suitable technique, including grinding or etching. In some embodiments, the planarization process may be omitted. In some embodiments, if a seed layer is deposited, the seed layer may be removed using any suitable process, including chemical etching, among others. In some embodiments, removal of the seed layer may be omitted.

Figure 4E:
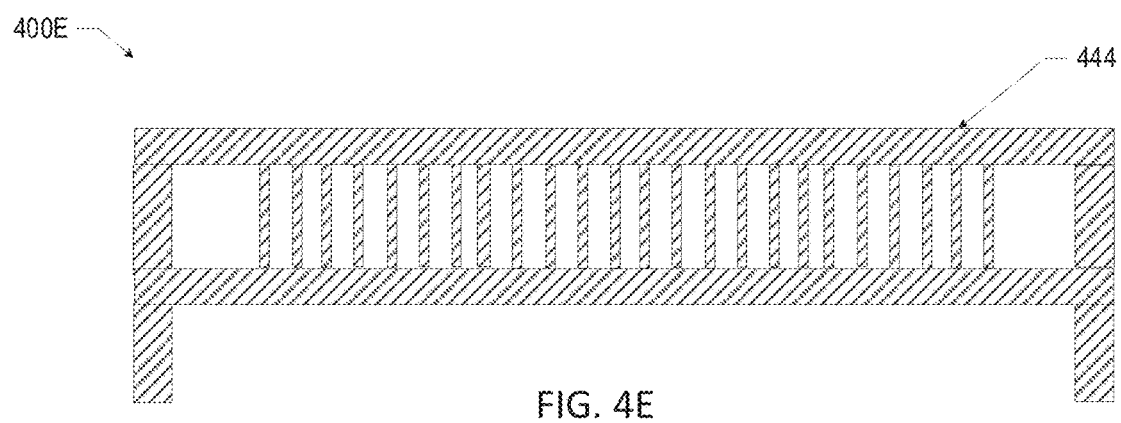

FIG. 4E illustrates an assembly 400E subsequent to attaching a conductive lid 444 to the top surface of assembly 400D. The conductive lid 444 may be a pre-fabricated stamped base or may be a copper sheet. In some embodiments, the conductive lid 444 may include legs for attaching to a package substrate. The conductive lid 444 may be formed from any suitable conductive metal, for example, copper. The conductive lid may be attached to the assembly 400D using any suitable technique, including, for example, brazing, thermal compression, epoxy curing, or diffusion bonding. In some embodiments, openings for a fluid inlet and a fluid outlet (not shown) may be formed in the conductive lid 444 prior to attachment to the assembly 400E. The finished assembly 400E (e.g., the cooling apparatus 140 in FIG. 1A) may be a single unit or may be a repeating unit, where multiple assemblies are formed on a conductive base material, that may undergo a singulation process in which each unit is separated from one another to create a single assembly.

Figure 4F:
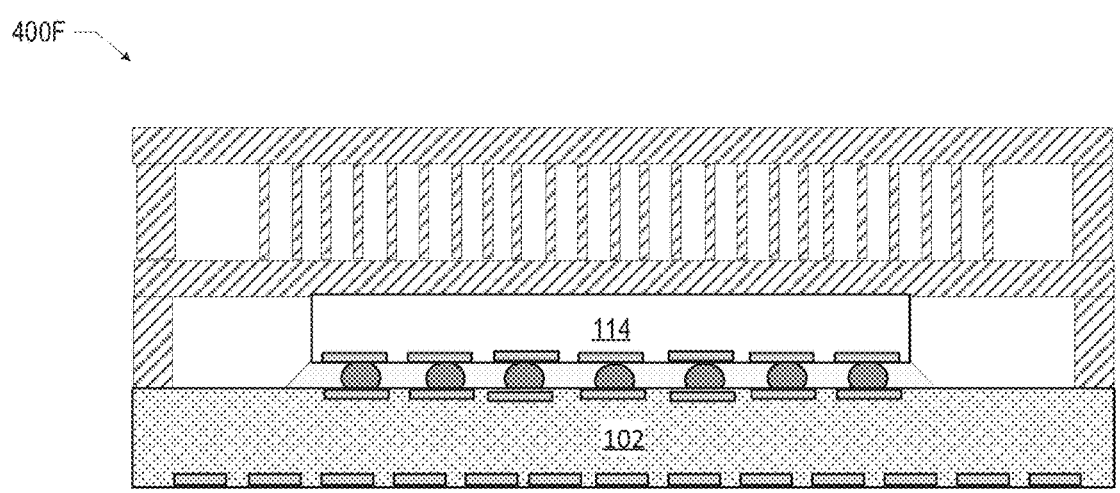

FIG. 4F illustrates an assembly 400F subsequent to attaching the assembly 400E to a package substrate 102 such that a top surface of a die 114 is in contact with a bottom surface of the conductive base 442. The assembly 400E may be attached to the package substrate 102 using any suitable technique, including, for example, brazing, thermal compression, or diffusion bonding. In some embodiments, a TIM (not shown) may be between the top surface of the die 114 and the bottom surface of the conductive base 442.

FIGS. 5A-5E are side, cross-sectional views of various stages in an example process for manufacturing a microelectronic assembly, in accordance with various embodiments.

Figure 5A:
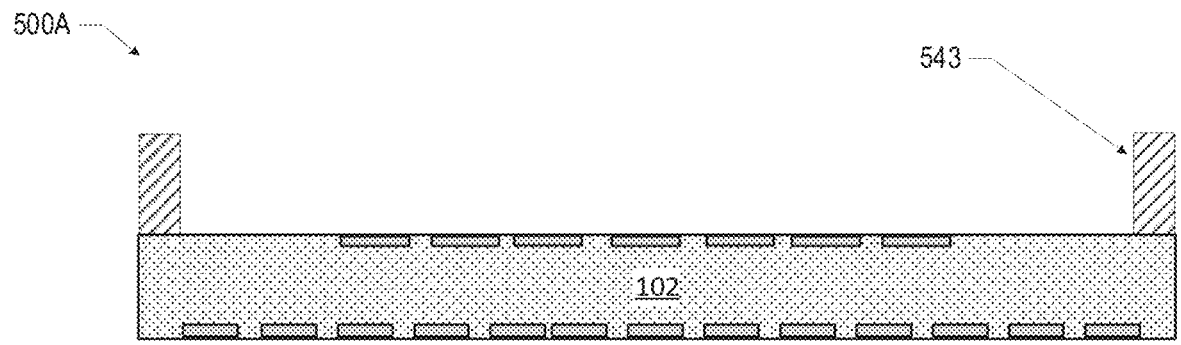
FIGS. 5A-5E are side, cross-sectional views of various stages in an example process for manufacturing a microelectronic assembly, in accordance with various embodiments.

FIG. 5A illustrates an assembly 500A including a package substrate 102 and conductive features 543 on the top surface of the package substrate 102. Any method known in the art for fabrication of the package substrate 102 may be used, and for the sake of brevity, such methods will not be discussed in further detail herein. In some embodiments, the conductive features 543 may be formed by depositing, exposing, and developing a photoresist layer on the top surface of the package substrate 102. The photoresist layer may be patterned to form the conductive features 543. Conductive material, such as copper, may be deposited in the openings in the patterned photoresist layer to form conductive features 543. The conductive material may be depositing using any suitable process, such as electroplating, sputtering, or electroless plating. The photoresist may be removed to expose the conductive features 543.

Figure 5B:
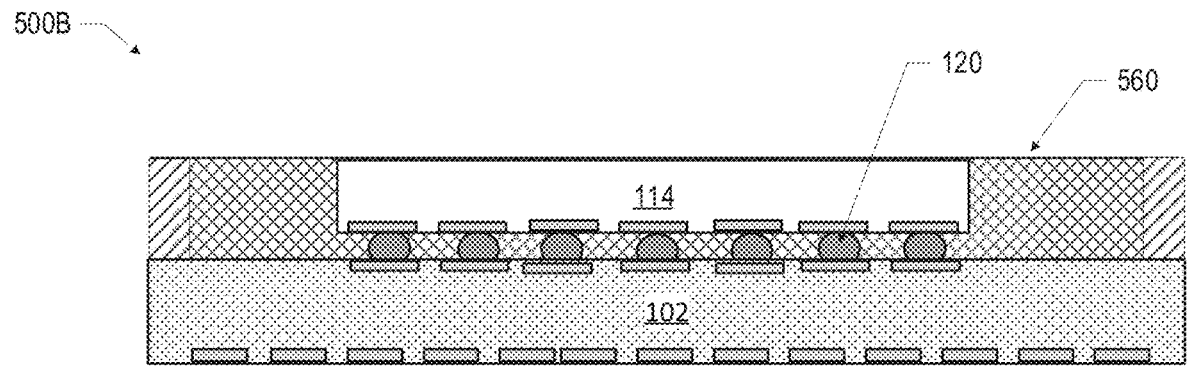

FIG. 5B illustrates an assembly 500B subsequent to coupling a die 114 to the package substrate 102 via first level interconnects 120 and forming an insulating material 560 over the die 114. The insulating material 560 may be deposited using any suitable process, including lamination, or slit coating and curing. The insulating material 560 may be deposited to completely cover the conductive features 543 and the die 114, such that the thickness of the deposited insulating material 560 is greater than the thickness of the conductive features 543 and the die, and then removed using any suitable technique, such as grinding or etching, to reveal the top surface of the conductive features 543 and the top surface of the die. In some embodiments, the insulating material 560 may be planarized using any suitable technique, including grinding. The insulating material 560 may include any suitable material, including a dielectric material or a mold material.

Figure 5C:
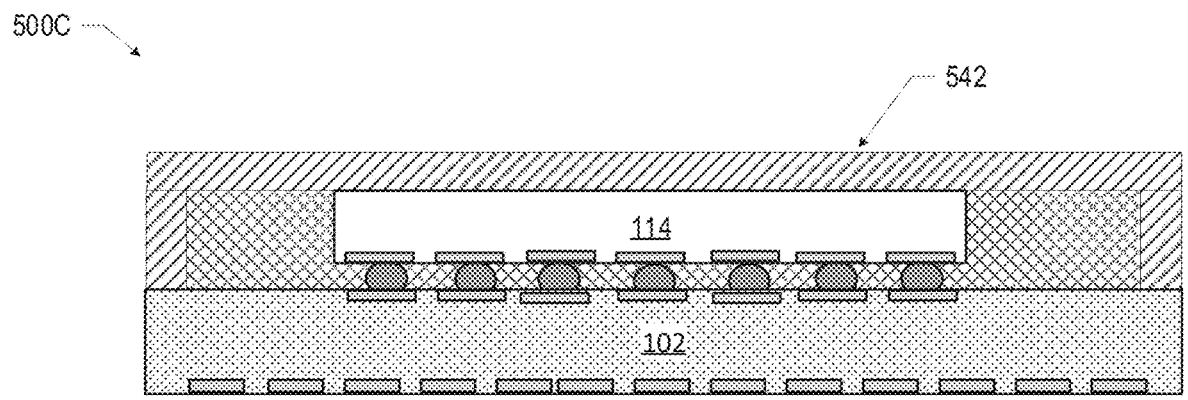

FIG. 5C illustrates an assembly 500C subsequent to depositing a conductive layer 542 over a top surface of the assembly 500B. The conductive layer 542 may be formed as a plane to cover the conductive features 543, the die 114, and the insulating material 560. The conductive layer 542 may be any suitable conductive material, including copper. In some embodiments, the conductive layer 542 may have a height between 50 um and 1 mm. In some embodiments, a seed layer (not shown) may be formed over the top surface of the assembly 500B prior to depositing the conductive layer 542. The seed layer may be any suitable conductive material, including copper.

Figure 5D:
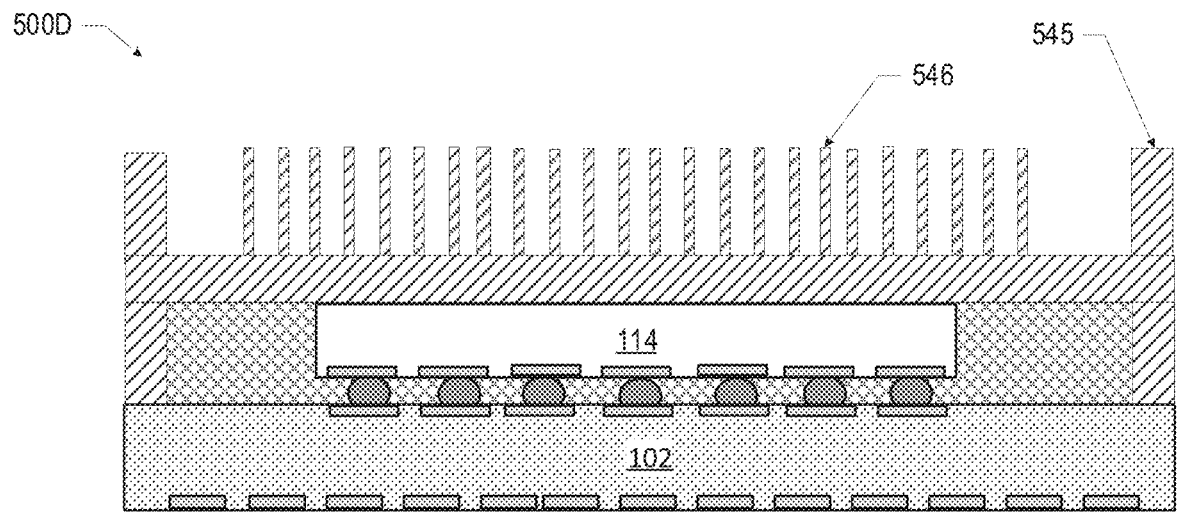

FIG. 5D illustrates an assembly 500D subsequent to forming conductive structures 546 and conductive features 545 on a top surface of the conductive layer 542. The conductive structures 546 and conductive features 545 may be formed using any suitable process, including, as described above with reference to FIG. 4.

Figure 5E:
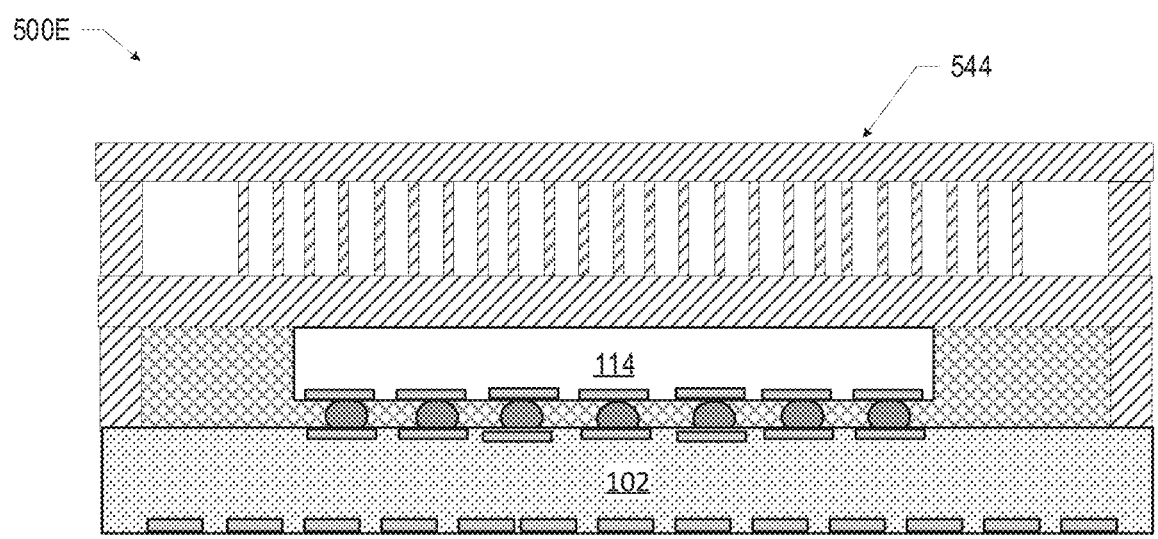

FIG. 5E illustrates an assembly 500E subsequent to attaching a conductive lid 544 to the top surface of assembly 500D. As described above with reference to FIG. 4, the conductive lid 544 may be a pre-fabricated stamped base or may be a copper sheet. In some embodiments, the conductive lid 544 may be a copper sheet that may be chemically etched, or laser etched, either as an individual unit or as multiple units, such as during panel level processing. The conductive lid 544 may be formed from any suitable conductive metal, for example, copper. The conductive lid 544 may be attached to the assembly 500D using any suitable technique, including, for example, brazing, thermal compression, or diffusion bonding. In some embodiments, openings for a fluid inlet and a fluid outlet (not shown) may be formed in the conductive lid 544 prior to attachment to the assembly 500E. The finished assembly 500E may be a single unit or may be a repeating unit, where multiple assemblies are formed on a package substrate, that may undergo a singulation process in which each unit is separated from one another to create a single assembly.

The microelectronic assemblies disclosed herein may be used for any suitable application. For example, in some embodiments, a microelectronic assembly 100 may be used to provide an ultra-high density and high bandwidth interconnect for field programmable gate array (FPGA) transceivers and III-V amplifiers. For example, the die 114 may include FPGA transceiver circuitry or III-V amplifiers, and/or FPGA logic.

In an example, the die 114 in a microelectronic assembly 100 may be a processing device (e.g., a central processing unit, a radio frequency chip, a power converter, a network processor, a graphics processing unit, a FPGA, a modem, an applications processor, etc.). In another example, the die 114 may include high bandwidth memory, transceiver circuitry, and/or input/output circuitry (e.g., Double Data Rate transfer circuitry, Peripheral Component Interconnect Express circuitry, etc.).

In another example, the die 114 in a microelectronic assembly 100 may be a cache memory (e.g., a third level cache memory), or a processing device (e.g., a central processing unit, a radio frequency chip, a power converter, a network processor, a graphics processing unit, a FPGA, a modem, an applications processor, etc.).

The microelectronic assemblies disclosed herein may be included in any suitable electronic component. FIGS. 6-9 illustrate various examples of apparatuses that may include, or be included in, any of the microelectronic assemblies disclosed herein.

Figure 6:
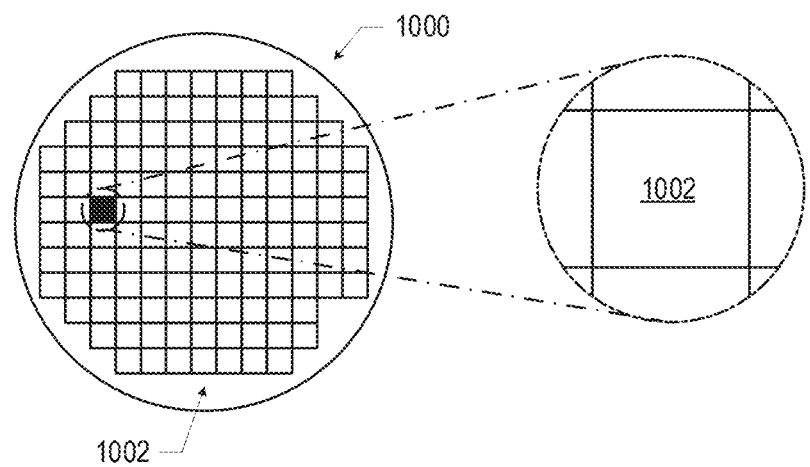
FIG. 6 is a top view of a wafer and dies that may be included in a microelectronic assembly, in accordance with any of the embodiments disclosed herein.

FIG. 6 is a top view of a wafer 1000 and dies 1002 that may be included in any of the microelectronic assemblies disclosed herein (e.g., any of the dies 114 disclosed herein). The wafer 1000 may be composed of semiconductor material and may include one or more dies 1002 having IC structures formed on a surface of the wafer 1000. Each of the dies 1002 may be a repeating unit of a semiconductor product that includes any suitable IC. After the fabrication of the semiconductor product is complete, the wafer 1000 may undergo a singulation process in which the dies 1002 are separated from one another to provide discrete "chips" of the semiconductor product. The die 1002 may be any of the dies 102/130 disclosed herein. The die 1002 may include one or more transistors (e.g., some of the transistors 1140 of FIG. 7, discussed below), supporting circuitry to route electrical signals to the transistors, passive components (e.g., signal traces, resistors, capacitors, or inductors), and/or any other IC components. In some embodiments, the wafer 1000 or the die 1002 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1002. For example, a memory array formed by multiple memory devices may be formed on a same die 1002 as a processing device (e.g., the processing device 1402 of FIG. 9) or other logic that is configured to store information in the memory devices or execute instructions stored in the memory array. Various ones of the microelectronic assemblies disclosed herein may be manufactured using a die-to-wafer assembly technique in which some dies are attached to a wafer 1000 that include others of the dies, and the wafer 1000 is subsequently singulated.

Figure 7:
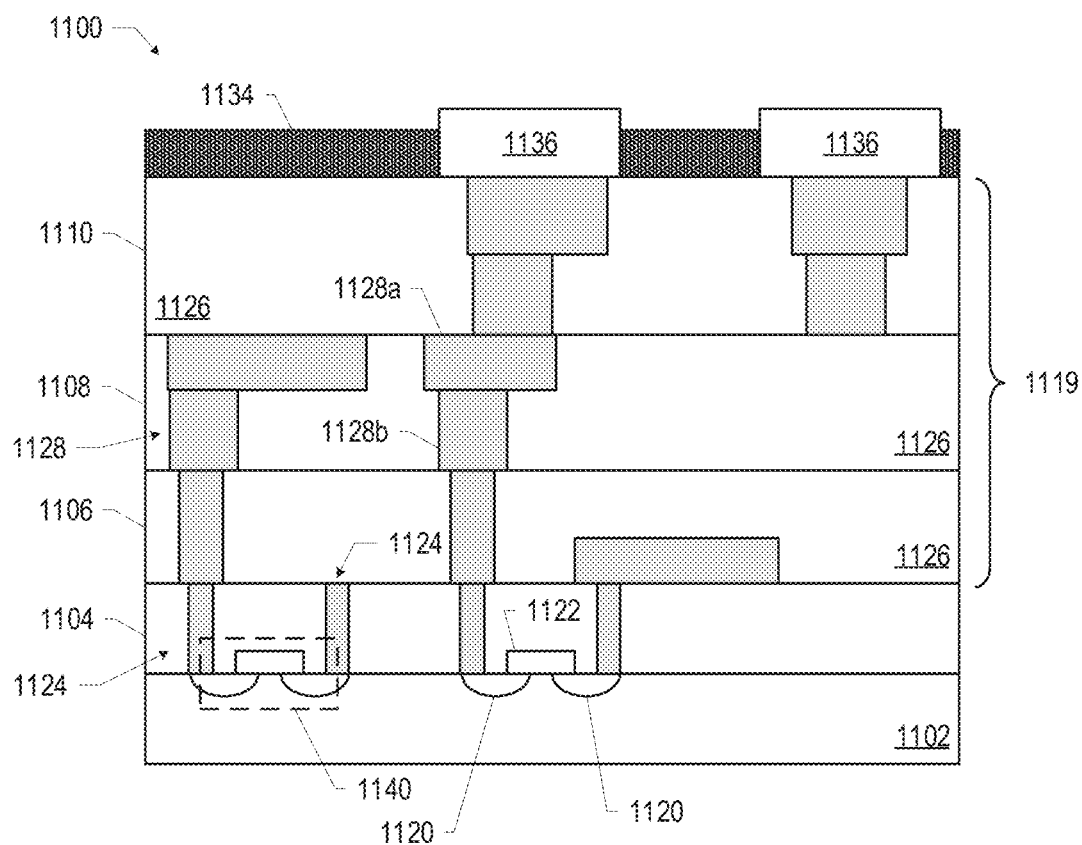
FIG. 7 is a cross-sectional side view of an integrated circuit device that may be included in a microelectronic assembly, in accordance with any of the embodiments disclosed herein.

FIG. 7 is a cross-sectional side view of an example IC device 1100 that may be included in any of the microelectronic assemblies disclosed herein (e.g., in any of the dies 114). One or more of the IC devices 1100 may be included in one or more dies 1002 (FIG. 6). The IC device 1100 may be formed on a substrate 1102 (e.g., the wafer 1000 of FIG. 6) and may be included in a die (e.g., the die 1002 of FIG. 6). The substrate 1102 may be a semiconductor substrate composed of semiconductor material systems including, for example, n-type or p-type materials systems (or a combination of both). The substrate 1102 may include, for example, a crystalline substrate formed using a bulk silicon or a silicon-on-insulator (SOI) substructure. In some embodiments, the substrate 1102 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1102. Although a few examples of materials from which the substrate 1102 may be formed are described here, any material that may serve as a foundation for an IC device 1100 may be used. The substrate 1102 may be part of a singulated die (e.g., the dies 1002 of FIG. 6) or a wafer (e.g., the wafer 1000 of FIG. 6).

The IC device 1100 may include one or more device layers 1104 disposed on the substrate 1102. The device layer 1104 may include features of one or more transistors 1140 (e.g., metal oxide semiconductor field-effect transistors (MOSFETs)) formed on the substrate 1102 and/or any other active and/or passive circuitry as may be desired by a device manufacturer. The device layer 1104 may include, for example, one or more source and/or drain (S/D) regions 1120, a gate 1122 to control current flow in the transistors 1140 between the S/D regions 1120, and one or more S/D contacts 1124 to route electrical signals to/from the S/D regions 1120. The transistors 1140 may include additional features not depicted for the sake of clarity, such as device isolation regions, gate contacts, and the like. The transistors 1140 are not limited to the type and configuration depicted in FIG. 7 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1140 may include a gate 1122 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1140 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1140 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1120 may be formed within the substrate 1102 adjacent to the gate 1122 of each transistor 1140. The S/D regions 1120 may be formed using an implantation/diffusion process or an etching/deposition process, for example. In the former process, dopants such as boron, aluminum, antimony, phosphorous, or arsenic may be ion-implanted into the substrate 1102 to form the S/D regions 1120. An annealing process that activates the dopants and causes them to diffuse farther into the substrate 1102 may follow the ion-implantation process. In the latter process, the substrate 1102 may first be etched to form recesses at the locations of the S/D regions 1120. An epitaxial deposition process may then be carried out to fill the recesses with material that is used to fabricate the S/D regions 1120. In some implementations, the S/D regions 1120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1120 may be formed using one or more alternate semiconductor materials such as germanium or a group III-V material or alloy. In further embodiments, one or more layers of metal and/or metal alloys may be used to form the S/D regions 1120.

Electrical signals, such as power and/or input/output (I/O) signals, may be routed to and/or from the devices (e.g., transistors 1140) of the device layer 1104 through one or more interconnect layers disposed on the device layer 1104 (illustrated in FIG. 7 as interconnect layers 1106, 1108, and 1110). For example, electrically conductive features of the device layer 1104 (e.g., the gate 1122 and the S/D contacts 1124) may be electrically coupled with the interconnect structures 1128 of the interconnect layers 1106-1110. The one or more interconnect layers 1106-1110 may form a metallization stack (also referred to as an "ILD stack") 1119 of the IC device 1100.

The interconnect structures 1128 may be arranged within the interconnect layers 1106-1110 to route electrical signals according to a wide variety of designs. In particular, the arrangement is not limited to the particular configuration of interconnect structures 1128 depicted in FIG. 7. For example, the interconnect structures may be arranged as multidirectional interconnect structures. Although a particular number of interconnect layers 1106-1110 is depicted in FIG. 7, embodiments of the present disclosure include IC devices having more or fewer interconnect layers than depicted.

In some embodiments, the interconnect structures 1128 may include lines 1128a and/or vias 1128b filled with an electrically conductive material such as a metal. The lines 1128a may be arranged to route electrical signals in a direction of a plane that is substantially parallel with a surface of the substrate 1102 upon which the device layer 1104 is formed. For example, the lines 1128a may route electrical signals in a direction in and out of the page from the perspective of FIG. 7. The vias 1128b may be arranged to route electrical signals in a direction of a plane that is substantially perpendicular to the surface of the substrate 1102 upon which the device layer 1104 is formed. In some embodiments, the vias 1128b may electrically couple lines 1128a of different interconnect layers 1106-1110 together.

The interconnect layers 1106-1110 may include a dielectric material 1126 disposed between the interconnect structures 1128, as shown in FIG. 7. In some embodiments, the dielectric material 1126 disposed between the interconnect structures 1128 in different ones of the interconnect layers 1106-1110 may have different compositions; in other embodiments, the composition of the dielectric material 1126 between different interconnect layers 1106-1110 may be the same.

A first interconnect layer 1106 (referred to as Metal 1 or "M1") may be formed directly on the device layer 1104. In some embodiments, the first interconnect layer 1106 may include lines 1128a and/or vias 1128b, as shown. The lines 1128a of the first interconnect layer 1106 may be coupled with contacts (e.g., the S/D contacts 1124) of the device layer 1104.

A second interconnect layer 1108 (referred to as Metal 2 or "M2") may be formed directly on the first interconnect layer 1106. In some embodiments, the second interconnect layer 1108 may include vias 1128b to couple the lines 1128a of the second interconnect layer 1108 with the lines 1128a of the first interconnect layer 1106. Although the lines 1128a and the vias 1128b are structurally delineated with a line within each interconnect layer (e.g., within the second interconnect layer 1108) for the sake of clarity, the lines 1128a and the vias 1128b may be structurally and/or materially contiguous (e.g., simultaneously filled during a dual-damascene process) in some embodiments.

A third interconnect layer 1110 (referred to as Metal 3 or "M3") (and additional interconnect layers, as desired) may be formed in succession on the second interconnect layer 1108 according to similar techniques and configurations described in connection with the second interconnect layer 1108 or the first interconnect layer 1106. In some embodiments, the interconnect layers that are "higher up" in the metallization stack 1119 in the IC device 1100 (i.e., farther away from the device layer 1104) may be thicker.

The IC device 1100 may include a solder resist material 1134 (e.g., polyimide or similar material) and one or more conductive contacts 1136 formed on the interconnect layers 1106-1110. In FIG. 7, the conductive contacts 1136 are illustrated as taking the form of bond pads. The conductive contacts 1136 may be electrically coupled with the interconnect structures 1128 and configured to route the electrical signals of the transistor(s) 1140 to other external devices. For example, solder bonds may be formed on the one or more conductive contacts 1136 to mechanically and/or electrically couple a chip including the IC device 1100 with another component (e.g., a circuit board). The IC device 1100 may include additional or alternate structures to route the electrical signals from the interconnect layers 1106-1110; for example, the conductive contacts 1136 may include other analogous features (e.g., posts) that route the electrical signals to external components. The conductive contacts 1136 may serve as the conductive contacts 122 or 124, as appropriate.

In embodiments in which the IC device 1100 is a double-sided die (e.g., like the die 114), the IC device 1100 may include another metallization stack (not shown) on the opposite side of the device layer(s) 1104. This metallization stack, may include multiple interconnect layers as discussed above with reference to the interconnect layers 1106-1110, to provide conductive pathways (e.g., including conductive lines and vias) between the device layer(s) 1104 and additional conductive contacts (not shown) on the opposite side of the IC device 1100 from the conductive contacts 1136.

Figure 8:
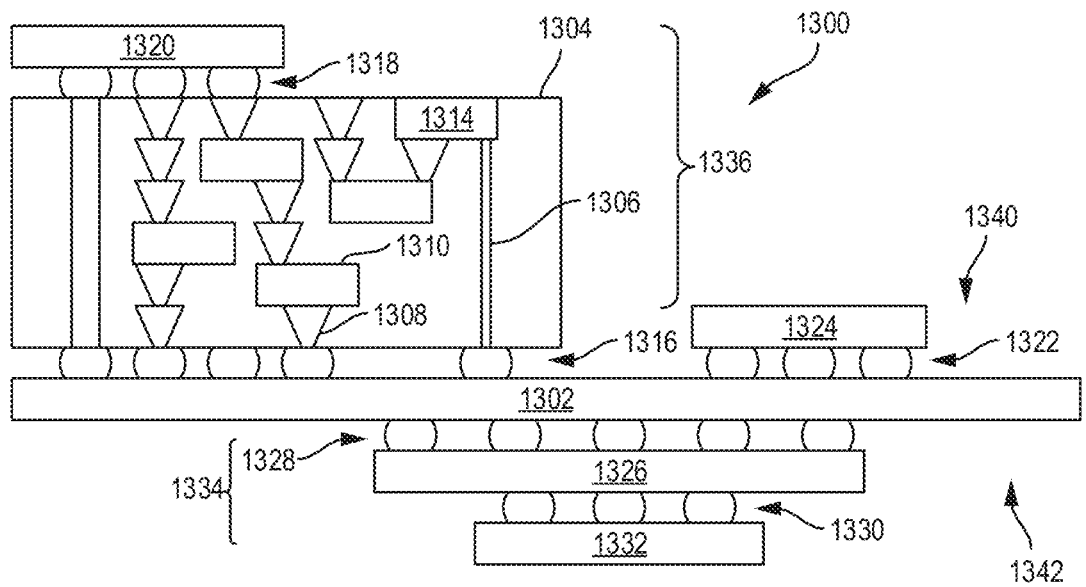
FIG. 8 is a cross-sectional side view of an integrated circuit device assembly that may include a microelectronic assembly, in accordance with any of the embodiments disclosed herein.

FIG. 8 is a cross-sectional side view of an IC device assembly 1300 that may include any of the microelectronic assemblies disclosed herein. In some embodiments, the IC device assembly 1300 may be a microelectronic assembly 100. The IC device assembly 1300 includes a number of components disposed on a circuit board 1302 (which may be, e.g., a motherboard). The IC device assembly 1300 includes components disposed on a first surface 1340 of the circuit board 1302 and an opposing second surface 1342 of the circuit board 1302; generally, components may be disposed on one or both surfaces 1340 and 1342. Any of the IC packages discussed below with reference to the IC device assembly 1300 may take the form of any suitable ones of the embodiments of the microelectronic assemblies disclosed herein.

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 8 includes a package-on-interposer structure 1336 coupled to the first surface 1340 of the circuit board 1302 by coupling components 1316. The coupling components 1316 may electrically and mechanically couple the package-on-interposer structure 1336 to the circuit board 1302, and may include solder balls (as shown in FIG. 8), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG.

8, multiple IC packages may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1002 of FIG. 6), or any other suitable component. Generally, the interposer 1304 may spread a connection to a wider pitch or reroute a connection to a different connection. For example, the interposer 1304 may couple the IC package 1320 (e.g., a die) to a set of ball grid array (BGA) conductive contacts of the coupling components 1316 for coupling to the circuit board 1302. In the embodiment illustrated in FIG. 8, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

In some embodiments, the interposer 1304 may be formed as a PCB, including multiple metal layers separated from one another by layers of dielectric material and interconnected by electrically conductive vias. In some embodiments, the interposer 1304 may be formed of an epoxy resin, a fiberglass-reinforced epoxy resin, an epoxy resin with inorganic fillers, a ceramic material, or a polymer material such as polyimide. In some embodiments, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to TSVs 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first surface 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 8 includes a package-on-package structure 1334 coupled to the second surface 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 9:
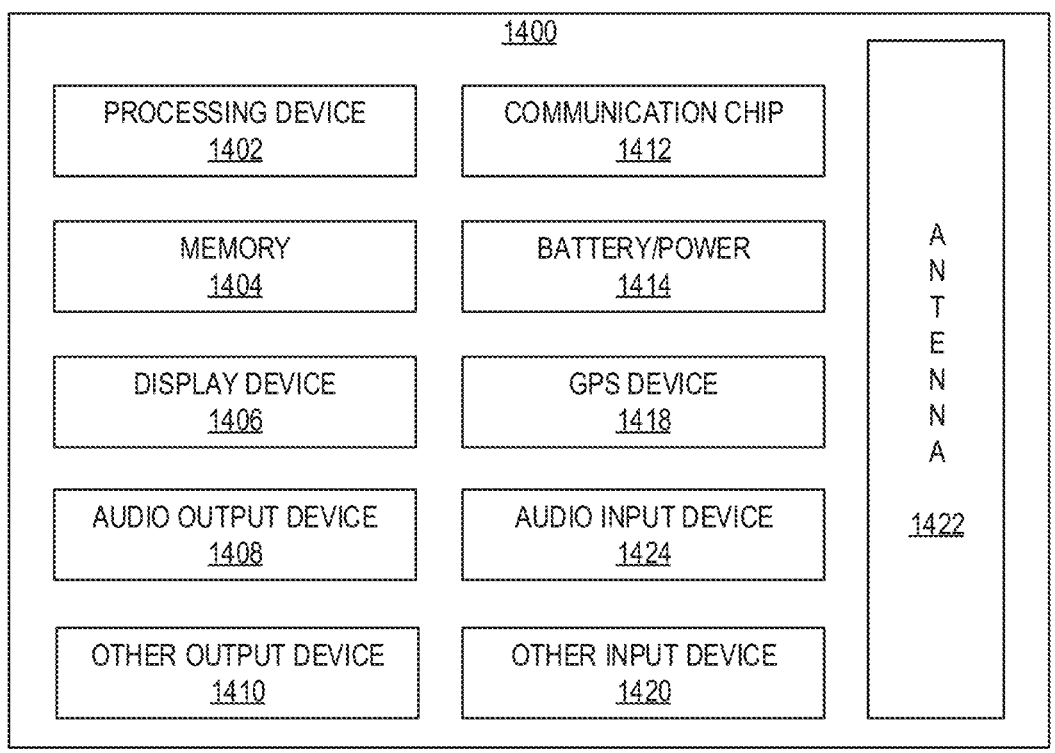
FIG. 9 is a block diagram of an example electrical device that may include a microelectronic, in accordance with any of the embodiments disclosed herein.

FIG. 9 is a block diagram of an example electrical device 1400 that may include one or more of the microelectronic assemblies disclosed herein. For example, any suitable ones of the components of the electrical device 1400 may include one or more of the IC device assemblies 1300, IC devices 1100, or dies 1002 disclosed herein, and may be arranged in any of the microelectronic assemblies disclosed herein. A number of components are illustrated in FIG. 9 as included in the electrical device 1400, but any one or more of these components may be omitted or duplicated, as suitable for the application. In some embodiments, some or all of the components included in the electrical device 1400 may be attached to one or more motherboards. In some embodiments, some or all of these components are fabricated onto a single system-on-a-chip (SoC) die.

Additionally, in various embodiments, the electrical device 1400 may not include one or more of the components illustrated in FIG. 9, but the electrical device 1400 may include interface circuitry for coupling to the one or more components. For example, the electrical device 1400 may not include a display device 1406, but may include display device interface circuitry (e.g., a connector and driver circuitry) to which a display device 1406 may be coupled. In another set of examples, the electrical device 1400 may not include an audio input device 1424 or an audio output device 1408, but may include audio input or output device interface circuitry (e.g., connectors and supporting circuitry) to which an audio input device 1424 or audio output device 1408 may be coupled.

The electrical device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1400 may include a memory 1404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded dynamic random access memory (eDRAM) or spin transfer torque magnetic random access memory (STT-M RAM).

In some embodiments, the electrical device 1400 may include a communication chip 1412 (e.g., one or more communication chips). For example, the communication chip 1412 may be configured for managing wireless communications for the transfer of data to and from the electrical device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The electrical device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as global positioning system (GPS), EDGE, GPRS, CDMA, WiMAX, LTE, EV-DO, or others. In some embodiments, a first communication chip 1412 may be dedicated to wireless communications, and a second communication chip 1412 may be dedicated to wired communications.

The electrical device 1400 may include battery/power circuitry 1414. The battery/power circuitry 1414 may include one or more energy storage devices (e.g., batteries or capacitors) and/or circuitry for coupling components of the electrical device 1400 to an energy source separate from the electrical device 1400 (e.g., AC line power).

The electrical device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display.

The electrical device 1400 may include an audio output device 1408 (or corresponding interface circuitry, as discussed above). The audio output device 1408 may include any device that generates an audible indicator, such as speakers, headsets, or earbuds.

The electrical device 1400 may include an audio input device 1424 (or corresponding interface circuitry, as discussed above). The audio input device 1424 may include any device that generates a signal representative of a sound, such as microphones, microphone arrays, or digital instruments (e.g., instruments having a musical instrument digital interface (MIDI) output).

The electrical device 1400 may include a GPS device 1418 (or corresponding interface circuitry, as discussed above). The GPS device 1418 may be in communication with a satellite-based system and may receive a location of the electrical device 1400, as known in the art.

The electrical device 1400 may include another output device 1410 (or corresponding interface circuitry, as discussed above). Examples of the other output device 1410 may include an audio codec, a video codec, a printer, a wired or wireless transmitter for providing information to other devices, or an additional storage device.

The electrical device 1400 may include another input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1400 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1400 may be any other electronic device that processes data.

The following paragraphs provide various examples of the embodiments disclosed herein.

Example 1 is a microelectronic assembly, including: a package substrate having a surface; a die having a first surface and an opposing second surface, wherein the first surface of the die is coupled to the surface of the package substrate; and a cooling apparatus, including: a conductive base having a first surface and an opposing second surface, wherein the first surface of the conductive base is in thermal contact with the second surface of the die; and a plurality of conductive structures on the second surface of the conductive base, wherein an individual conductive structure of the plurality of conductive structures has a width between 10 microns and 100 microns.

Example 2 may include the subject matter of Example 1, and may further specify that individual conductive structures of the plurality of conductive structures have a height between 1 mm and 2 mm.

Example 3 may include the subject matter of Example 1, and may further specify that an individual one of the plurality of conductive structures has an aspect ratio between 10:1 and 20:1.

Example 4 may include the subject matter of Example 1, and may further specify that a channel between adjacent individual ones of the conductive structures has a width between 10 microns and 200 microns.

Example 5 may include the subject matter of Example 1, and may further specify that at least one of the plurality of conductive structures is a vertical fin.

Example 6 may include the subject matter of Example 5, and may further specify that the vertical fin has a surface that is non-linear.

Example 7 may include the subject matter of Example 1, and may further specify that at least one of the plurality of conductive structures is a pillar.

Example 8 may include the subject matter of Example 7, and may further specify that the pillar has a cross-section that is circular.

Example 9 may include the subject matter of Example 7, and may further specify that the pillar has a cross-section that is non-circular.

Example 10 may include the subject matter of Example 1, and may further specify that a first individual one of the plurality of conductive structures is a pillar and a second individual one of the plurality of conductive structures is a vertical fin.

Example 11 may include the subject matter of Example 1, and may further include: a conductive lid, wherein the conductive lid is on a top surface of the plurality of conductive structures, and wherein the conductive lid forms a cavity around the plurality of conductive structures.

Example 12 may include the subject matter of Example 11, and may further include: a fluid in the cavity.

Example 13 may include the subject matter of Example 12, and may further specify that the fluid is a gas.

Example 14 may include the subject matter of Example 12, and may further specify that the fluid is a liquid.

Example 15 may include the subject matter of Example 14, and may further specify that the fluid includes water.

Example 16 may include the subject matter of Example 1, and may further include: a thermal interface material between the second surface of the die and the first surface of the conductive base.

Example 17 is a microelectronic assembly, including: a package substrate having a first surface and an opposing second surface; a die having a first surface and an opposing second surface, wherein the first surface of the die is coupled to the second surface of the package substrate; and a cooling apparatus, including: a conductive base having a first surface and an opposing second surface, wherein the first surface of the conductive base is in contact with the second surface of the die; and a plurality of conductive structures on the second surface of the conductive base, wherein the plurality of conductive structures have at least one non-linear surface.

Example 18 may include the subject matter of Example 17, and may further specify that at least one of the plurality of conductive structures is a vertical fin.

Example 19 may include the subject matter of Example 17, and may further specify that at least one of the plurality of conductive structures is a pillar.

Example 20 may include the subject matter of Example 19, and may further specify that the pillar has a cross-section that is circular.

Example 21 may include the subject matter of Example 19, and may further specify that the pillar has a cross-section that is non-circular.

Example 22 may include the subject matter of Example 17, and may further specify that at least one of the plurality of conductive structures has a spiral shape.

Example 23 may include the subject matter of Example 17, and may further specify that the plurality of conductive structures are arranged symmetrically.

Example 24 may include the subject matter of Example 17, and may further specify that the plurality of conductive structures are arranged asymmetrically.

Example 25 is a microelectronic assembly, including: a package substrate having a first surface and an opposing second surface; a die having a first surface and an opposing second surface, wherein the first surface of the die is coupled to the second surface of the package substrate; and a cooling apparatus, including: a conductive base having a first surface and an opposing second surface, wherein the first surface of the conductive base is in contact with the second surface of the die; and a plurality of conductive structures on the second surface of the conductive base, wherein the plurality of conductive structures are attached to the second surface of the conductive base.

Example 26 may include the subject matter of Example 25, and may further include: a seed layer between the second surface of the conductive base and the plurality of conductive structures.

Example 27 may include the subject matter of Example 25, and may further specify that the conductive base includes a first material and the plurality of conductive structures include a second material different from the first material.

Example 28 may include the subject matter of Example 27, and may further specify that the first material includes copper.

Example 29 may include the subject matter of Example 27, and may further specify that the second material includes nickel.

Example 30 may include the subject matter of Example 25, and may further specify that the plurality of conductive structures are attached to the conductive base by growing the plurality of conductive structures on the conductive base via an electroplating process or an electroless plating process.

Example 31 may include the subject matter of Example 25, and may further specify that the die is a central processing unit, a radio frequency chip, a power converter, or a network processor.

Example 32 may include the subject matter of Example 25, and may further specify that the microelectronic assembly is included in a server device.

Example 33 may include the subject matter of Example 25, and may further specify that the microelectronic assembly is included in a portable computing device.

Example 34 may include the subject matter of Example 25, and may further specify that the microelectronic assembly included in a wearable computing device.

Example 35 is a method of manufacturing a microelectronic assembly, including: forming a conductive base having a first surface and an opposing second surface on a surface of a die, wherein the first surface of the conductive base faces the surface of the die; and forming a plurality of conductive structures on the second surface of the conductive base, wherein one or more of the plurality of conductive structures have a non-linear surface.

Example 36 may include the subject matter of Example 35, and may further specify that forming the plurality of conductive structures comprises: depositing a photoresist material on the second surface of the conductive base; forming openings in the photoresist material; depositing conductive material in the openings; and removing the photoresist material.

Example 37 may include the subject matter of Example 35, and may further include: depositing a seed layer on the second surface of the conductive base prior to forming the plurality of conductive structures.

Example 38 may include the subject matter of Example 35, and may further include: forming a conductive lid on a top surface of the plurality of conductive structures.

Example 39 may include the subject matter of Example 35, and may further specify that the die has a first surface and an opposing second surface, and wherein the conductive base is on the second surface of the die, and may further include: coupling the first surface of the die to a surface of a package substrate.

Example 40 may include the subject matter of Example 39, and may further include: coupling the first surface of the conductive base to the surface of the package substrate.

The invention claimed is:

1. A microelectronic assembly, comprising:
   a package substrate having a surface;
   a die having a first surface and an opposing second surface, wherein the first surface of the die is coupled to the surface of the package substrate;
   a cooling apparatus, comprising:
     a conductive base having a first surface and an opposing second surface, wherein the first surface of the conductive base is in thermal contact with the second surface of the die;
     a plurality of conductive structures on the second surface of the conductive base, wherein an individual conductive structure of the plurality of conductive structures has a width between 10 microns and 100 microns; and
     at least two conductive features extending from the first surface of the conductive base attached to the surface of the package substrate; and
   a conductive lid, wherein the conductive lid is on a top surface of the plurality of conductive structures, and wherein the conductive lid forms a cavity around the plurality of conductive structures.

2. The microelectronic assembly of claim 1, wherein individual conductive structures of the plurality of conductive structures have a height between 1 mm and 2 mm.

3. The microelectronic assembly of claim 1, wherein an individual one of the plurality of conductive structures has an aspect ratio between 10:1 and 20:1.

4. The microelectronic assembly of claim 1, wherein a channel between adjacent individual ones of the conductive structures has a width between 10 microns and 200 microns.

5. The microelectronic assembly of claim 1, wherein at least one of the plurality of conductive structures is a vertical fin.

6. The microelectronic assembly of claim 5, wherein the vertical fin has a surface that is non-linear.

7. The microelectronic assembly of claim 1, wherein at least one of the plurality of conductive structures is a pillar.

8. The microelectronic assembly of claim 1, wherein a first individual one of the plurality of conductive structures is a pillar and a second individual one of the plurality of conductive structures is a vertical fin.

9. The microelectronic assembly of claim 1, further comprising:
   a fluid in the cavity.

10. A microelectronic assembly, comprising:
    a package substrate having a first surface and an opposing second surface;
    a die having a first surface and an opposing second surface, wherein the first surface of the die is coupled to the second surface of the package substrate;
    a cooling apparatus, comprising:
      a conductive base having a first surface and an opposing second surface, wherein the first surface of the conductive base is in contact with the second surface of the die;
      a plurality of conductive structures on the second surface of the conductive base, wherein the plurality of conductive structures are attached to the second surface of the conductive base; and
      at least two conductive features extending from the first surface of the conductive base attached to the second surface of the package substrate; and
    a conductive seed layer between the second surface of the conductive base and the plurality of conductive structures.

11. The microelectronic assembly of claim 10, wherein the conductive base includes a first material and the plurality of conductive structures include a second material different from the first material.

12. The microelectronic assembly of claim 11, wherein the first material includes copper.

13. The microelectronic assembly of claim 11, wherein the second material includes nickel.

* * * * *